(12) United States Patent
Tang et al.

(10) Patent No.: US 11,151,930 B2
(45) Date of Patent: Oct. 19, 2021

(54) ELECTROLUMINESCENT DISPLAY PANEL AND DISPLAY DEVICE

(71) Applicant: WuHan TianMa Micro-Electronics Co., Ltd., Wuhan (CN)

(72) Inventors: Yuejun Tang, Wuhan (CN); Xudong Liang, Wuhan (CN); Yongzhi Wang, Wuhan (CN); Tao Peng, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/718,225

(22) Filed: Dec. 18, 2019

(65) Prior Publication Data

US 2020/0126472 A1 Apr. 23, 2020

(30) Foreign Application Priority Data

Aug. 30, 2019 (CN) .......................... 201910817502.6

(51) Int. Cl.
| | |
|---|---|
| *G06K 9/20* | (2006.01) |
| *G09G 3/30* | (2006.01) |
| *H01L 27/32* | (2006.01) |
| *G06K 9/00* | (2006.01) |
| *H01L 51/00* | (2006.01) |

(52) U.S. Cl.
CPC .......... *G09G 3/30* (2013.01); *G06K 9/00013* (2013.01); *G06K 9/00912* (2013.01); *H01L 27/3227* (2013.01); *H01L 27/3234* (2013.01); *H01L 27/3288* (2013.01); *H01L 51/0096* (2013.01)

(58) Field of Classification Search
CPC ................. G09G 3/30; G06K 9/00013; G06K 9/00912; H01L 27/3227; H01L 27/3234; H01L 27/3288; H01L 51/0096
See application file for complete search history.

(56) References Cited

U.S. PATENT DOCUMENTS

2020/0019804 A1* 1/2020 Kim .................... G06K 9/00912

FOREIGN PATENT DOCUMENTS

| CN | 106981585 A | 7/2017 |
|---|---|---|
| CN | 108287428 A | 7/2018 |
| CN | 108520888 A | 9/2018 |
| CN | 108807426 A | 11/2018 |

(Continued)

*Primary Examiner* — Abdul-Samad A Adediran
(74) *Attorney, Agent, or Firm* — Kilpatrick Townsend & Stockton

(57) ABSTRACT

Disclosed is an electroluminescent display panel and a display device, and relates to the field of display technologies. The display region comprises a photosensitive device arranging region, a camera or fingerprint recognition device is arranged in the photosensitive device arranging region, rather than in the frame, and thus a relatively larger area occupying in the frame is avoided, to allow the frame be made narrower, and the screen-to-body ratio be increased. Also for the photosensitive device arranging region, the first signal lines and the second signal lines are arranged more intensively by arranging a plurality of overlap areas in the orthographic projection of one first pixel on the base substrate, to allow the display panel have more concentrated space as the light-transmission region, so that the light transmittance of the photosensitive device arranging region can be increased to provide more lights to the camera or fingerprint recognition device.

20 Claims, 11 Drawing Sheets

(56) References Cited

FOREIGN PATENT DOCUMENTS

| | | |
|---|---|---|
| CN | 110061014 A | 7/2019 |
| WO | 2018147661 A1 | 8/2018 |
| WO | WO 2018/147661 * 8/2018 ......... G06K 9/00912 |

* cited by examiner

ELECTROLUMINESCENT DISPLAY PANEL AND DISPLAY DEVICE

CROSS REFERENCE TO RELATED APPLICATION

This application claims priority to Chinese Patent Application No. 201910817502.6, filed with the Chinese Patent Office on Aug. 30, 2019. The entire disclosure of the above application is incorporated herein by reference.

FIELD

The disclosure relates to the field of display technologies and particularly to an electroluminescent display panel and a display device.

BACKGROUND

Electroluminescent displays are a type of self light-emitting device, which can be operated without a backlight source, and thus can be applied to a variety of scenarios since the display can be made lighter and thinner than the liquid crystal display.

The display panel in the electroluminescent display generally has a display region and a frame region surrounding the display region. A camera and other optical devices may be arranged in the frame region. Due to the larger volume of the camera, the area of the frame region occupied by the camera is larger, which is a limit to allow the display panel to have high screen-to-body ratio and narrow frame design.

SUMMARY

The embodiments of the disclosure provide an electroluminescent display panel and a display device, to increase the screen-to-body ratio of the display panel and implement the narrow frame design.

In one embodiment of the disclosure provides an electroluminescent display panel. The electroluminescent display panel includes a display region including a photosensitive device arranging region and a normal display region which at least partly surrounds the photosensitive device arranging region. The display region includes a plurality of pixels including first pixels located in the photosensitive device arranging region, where a region between adjacent first pixels is a light-transmission region. The electroluminescent display panel further includes: a base substrate, and a plurality of first signal lines and a plurality of second signal lines located on the base substrate. The first pixels are electrically connected to the first signal lines and the second signal lines respectively, all the first signal lines are arranged in a column direction and extend in a row direction, and all the second signal lines are arranged in the row direction and extend in the column direction. The orthographic projections of the first signal lines and the second signal lines on the base substrate have overlap areas, and in the photosensitive device arranging region, a plurality of overlap areas are located in an orthographic projection of one first pixel on the base substrate.

In one embodiment of the disclosure provides a display device including: the above-mentioned electroluminescent display panel as provided by the embodiment of the disclosure; and a camera or fingerprint recognition device is arranged in the photosensitive device arranging region of the electroluminescent display panel.

For the electroluminescent display panel and the display device provided by the embodiments of the disclosure, firstly the display region includes a photosensitive device arranging region, and a camera or fingerprint recognition device is arranged in the photosensitive device arranging region, rather than in the frame, and thus a relatively larger area occupying in the frame is avoided, to allow the frame be made narrower, and the screen-to-body ratio be increased.

Secondly for the photosensitive device arranging region, the first signal lines and the second signal lines are arranged more intensively by arranging a plurality of overlap areas in the orthographic projection of one first pixel on the base substrate, to allow the display panel have more concentrated space as the light-transmission region, so that the light transmittance of the photosensitive device arranging region can be increased to provide more lights to the camera or fingerprint recognition device so that the camera or fingerprint recognition device can work normally and efficiently.

WHERE

A—display region
A1—normal display region
G—photosensitive device arranging region
S1—first signal line
S2, S21—second signal line
S0—signal line
T—light-transmission region
P1, P11, P12, P13, P14, P15, P16, P17, P18, P19, P20—first pixel
P2—second pixel
D—first segment
D2—second segment
D3—third segment
F1—first subsection
F2—second subsection
Z1, Z2, Z3—first signal line group
10—electroluminescent display panel
20—photosensitive device
100—display device

DETAILED DESCRIPTION OF EMBODIMENTS

Electroluminescent display panel and display device provided by the embodiments of the disclosure will be illustrated below in details with reference to the drawings.

Figure 1:
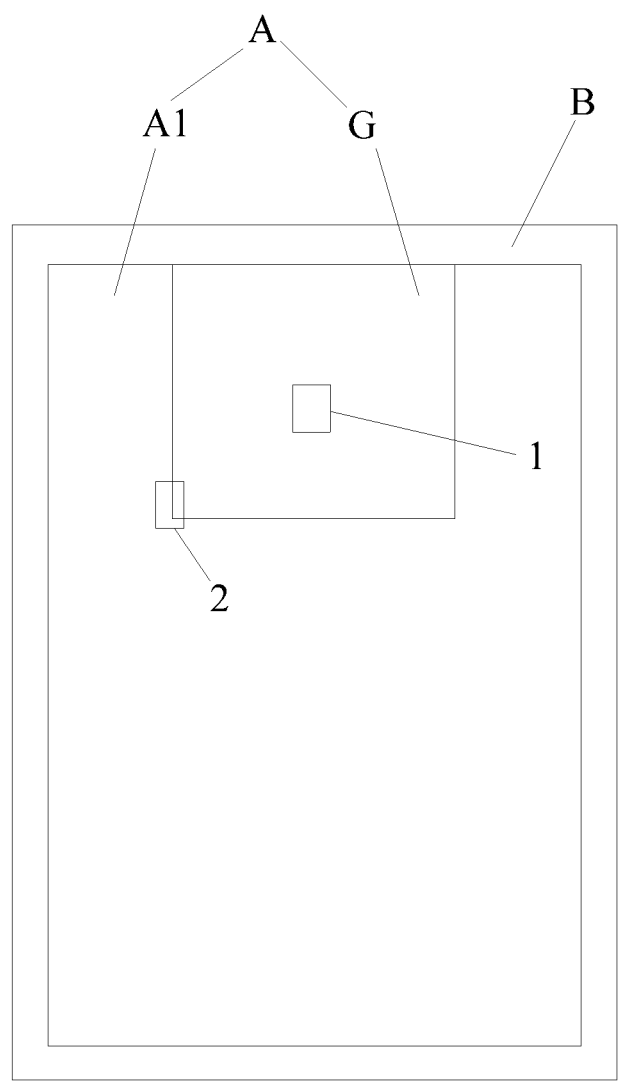
FIG. 1 is a structural schematic diagram of an electroluminescent display panel provided in some embodiments of the disclosure.
Figure 2:
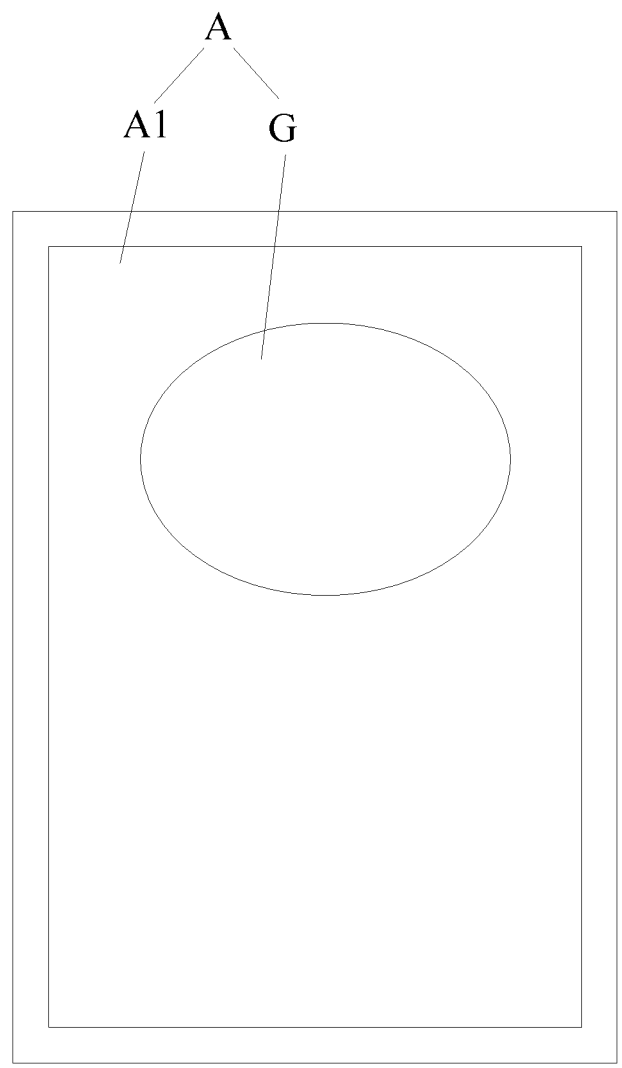
FIG. 2 is a structural schematic diagram of another electroluminescent display panel provided in some embodiments of the disclosure.

Embodiments of the disclosure provide an electroluminescent display panel, as illustrated in FIGS. 1-7, where FIG. 1 is a structural schematic diagram of an electroluminescent display panel, FIG. 2 is a structural schematic diagram of another electroluminescent display panel, and FIGS. 3-7 are the enlarged layout views of different structures inside the solid box 1 in FIG. 1 respectively.

According to one or more embodiments, as illustrated in FIGS. 1 and 2 according to, the electroluminescent display panel includes a display region A, and the display region A includes a photosensitive device arranging region G and a normal display region A1 which at least partly surrounds the photosensitive device arranging region G.

According to one or more embodiments, as illustrated in FIGS. 3-7, the display region A includes a plurality of pixels including the first pixels (such as P11, P12, P13, P14, P15, P16, P17, P18, P19, P20) located in the photosensitive device arranging region G; where the region between the adjacent first pixels is the light-transmission region T; the external light can be incident into the photosensitive device (e.g., camera or fingerprint recognition device or the like) through the light-transmission region T, so that the photosensitive device works after receiving the incident light.

The electroluminescent display panel further includes: a base substrate (not shown in FIGS. 1-7), and a plurality of first signal lines S1 and a plurality of second signal lines S2 located on the base substrate, where the first pixels are electrically connected to the first signal lines S1 and the second signal lines S2 respectively, all the first signal lines S1 are arranged in the column direction and extend in the row direction, and all the second signal lines S2 are arranged in the row direction and extend in the column direction.

The orthographic projections of the first signal lines S1 and the second signal lines S2 on the base substrate have the overlap areas (which can be understood as the intersecting positions of the first signal lines S1 and the second signal lines S2 in FIGS. 3-7), and in the photosensitive device arranging region G, a plurality of overlap areas are located in the orthographic projection of one first pixel on the base substrate.

In one or more embodiments of the disclosure, the display region includes the photosensitive device arranging region G, and a camera or fingerprint recognition device is arranged in the photosensitive device arranging region, rather than in the frame, and thus a relatively larger area occupying in the frame is avoided, to allow the frame be made narrower, and the screen-to-body ratio be increased.

In the actual situation, for the photosensitive device arranging region G, if the orthographic projection of each first pixel on the base substrate corresponds to one overlap area, the first signal lines S1 and the second signal lines S2 are arranged relatively distributed; and if the first signal lines S1 and the second signal lines S2 are made of the electrically conductive material with lower light transmittance, the distributed first signal lines S1 and second signal lines S2 may block more light which will bring the decreased light transmittance.

In one or more embodiment of the disclosure, for the photosensitive device arranging region G, the first signal lines S1 and the second signal lines S2 are arranged more intensively by arranging a plurality of overlap areas in the orthographic projection of one first pixel on the base substrate, to allow the display panel have more concentrated space as the light-transmission region, so that the light transmittance of the photosensitive device arranging region G can be increased to provide more lights to the camera or fingerprint recognition device so that the camera or fingerprint recognition device can work normally and efficiently.

Figure 10:
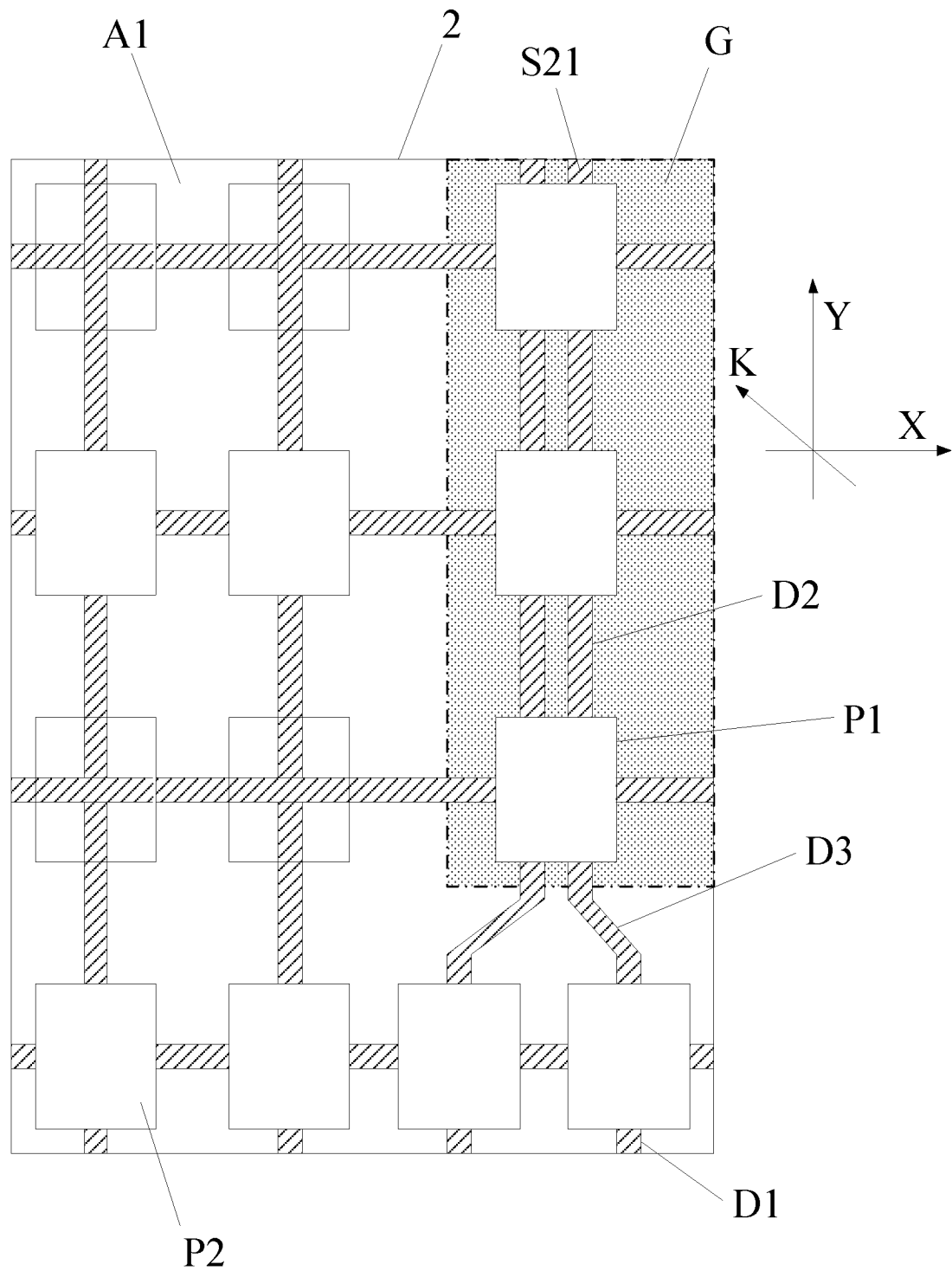
FIG. 10 is an enlarged layout view of a portion inside the solid box 2 in FIG. 1.

In one or more embodiments of the disclosure, as illustrated in FIG. 10 which is an enlarged view of the solid box 2 in FIG. 1, the pixels further include the second pixels P2 arranged in an array and located in the normal display region A1, where the arranging density of the second pixels P2 is larger than the arranging density of the first pixels P1. Further, in the normal display region A1, there is an overlap area in the orthographic projection(s) of at least a part of the second pixels P2 on the base substrate, to ensure the normal display function of the normal display region A1. Since there is no special requirement on the light transmittance for the normal display region A1, the second pixels P2 and the overlap areas in this region can be arranged without specific limitations, to lower the structure complexity of the electroluminescent display panel and thus lower the difficulty of fabricating the electroluminescent display panel.

In one or more embodiments of the disclosure, the shape of the photosensitive device arranging region G can be a square (as illustrated in FIG. 1) or can be an oval (as illustrated in FIG. 2). Of course, it can also be another shape, which is not limited here and can be set according to the actual demand to increase the design flexibility.

In one or more embodiments of the disclosure, the first signal lines S1 are the scan lines, reference signal lines or light emission control signal lines, and the second signal lines S2 are the data lines or power supply signal lines, as illustrated in FIGS. 3-7. In one embodiment, in some embodiments, the first signal lines are the data lines or power supply signal lines, and the second signal lines are the scan lines, reference signal lines or light emission control signal lines, which is not limited here. The following is illustrated in an example where the first signal lines S1 are the scan lines, reference signal lines or light emission control signal lines and the second signal lines S2 are the data lines or power supply signal lines.

Figure 3:
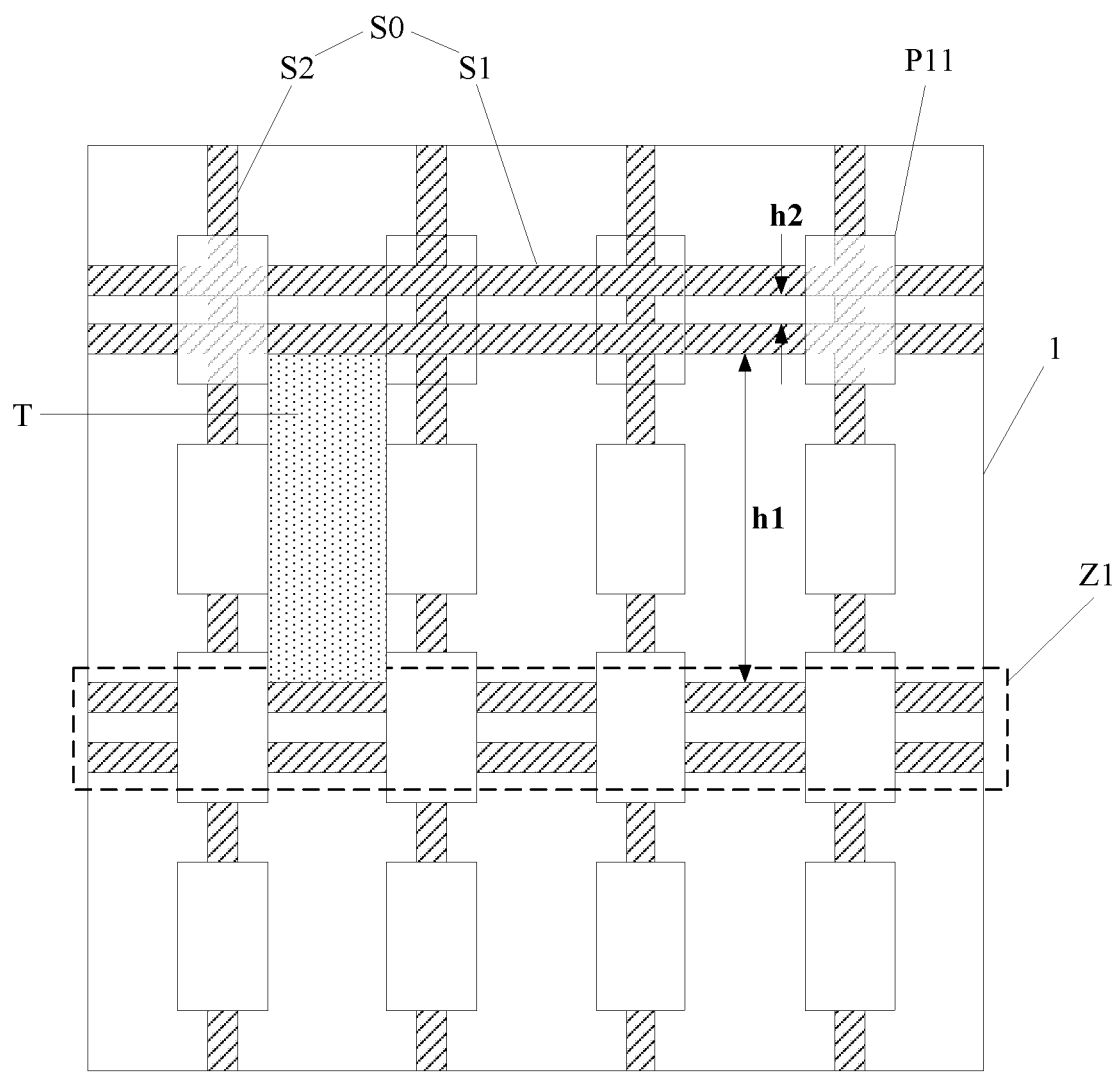
FIGS. 3, 4, 5, 6 and 7 are different enlarged layout views of a portion inside the solid box 1 in FIG. 1 respectively.
Figure 4:
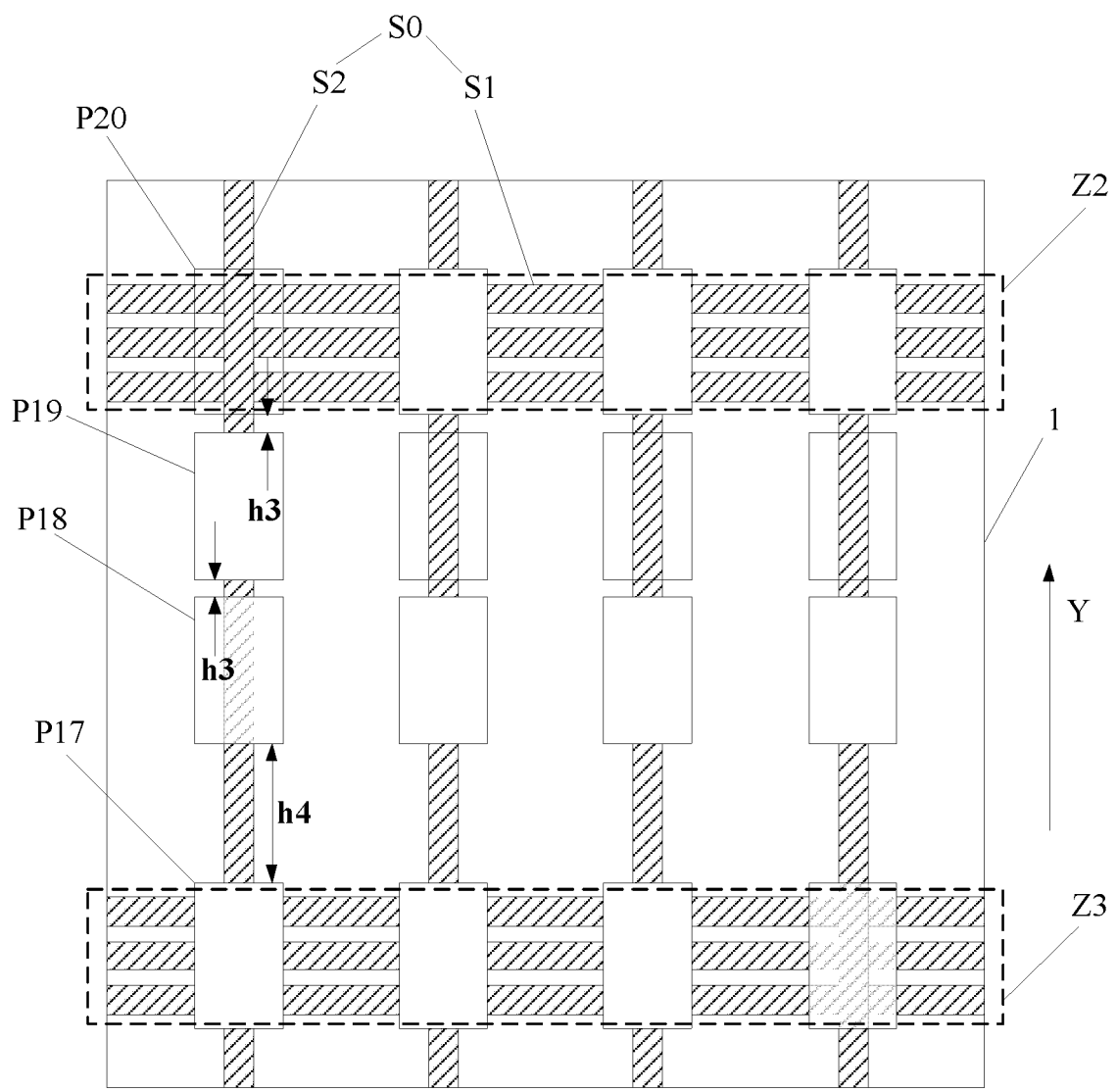
Figure 5:
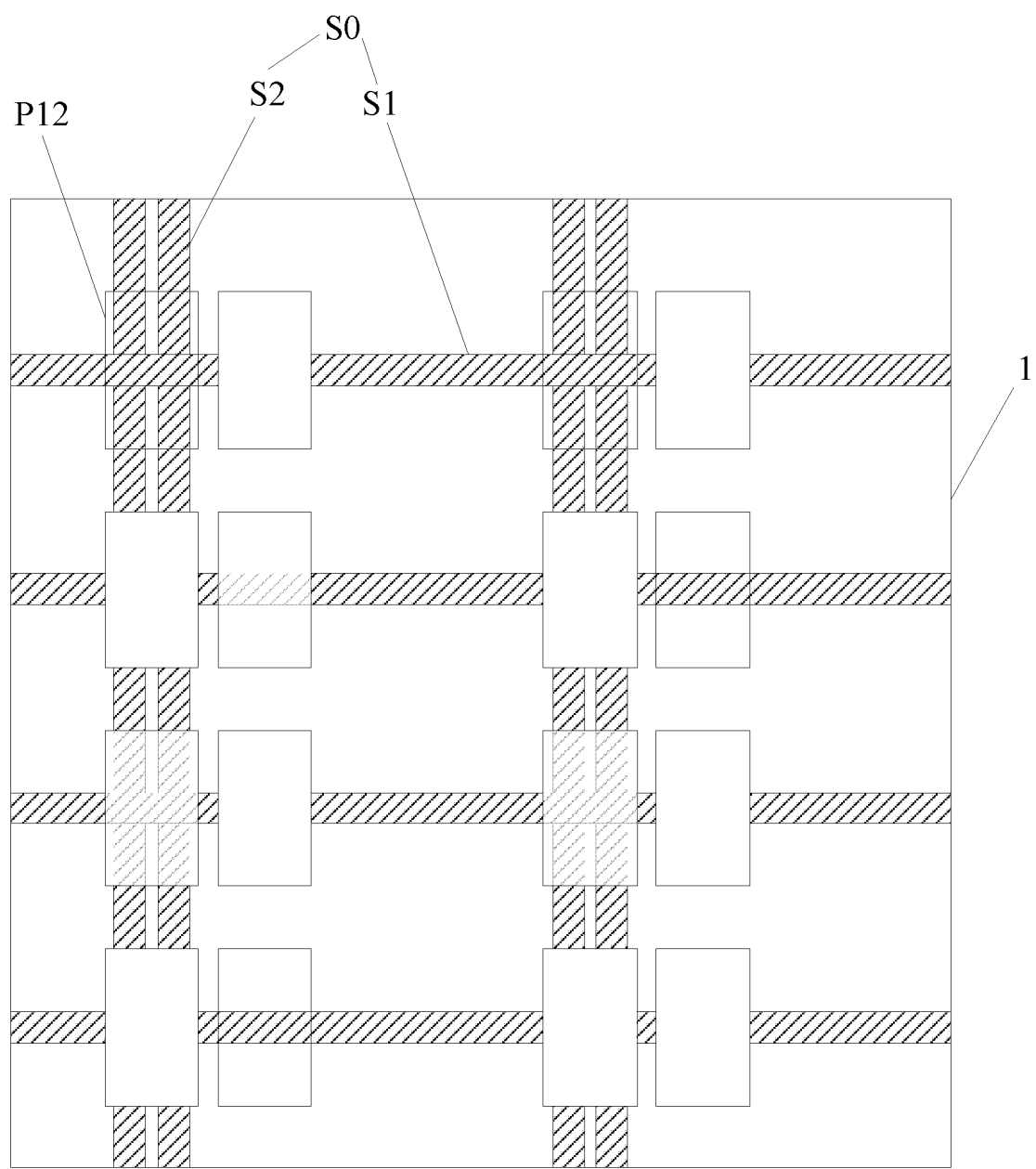
Figure 6:
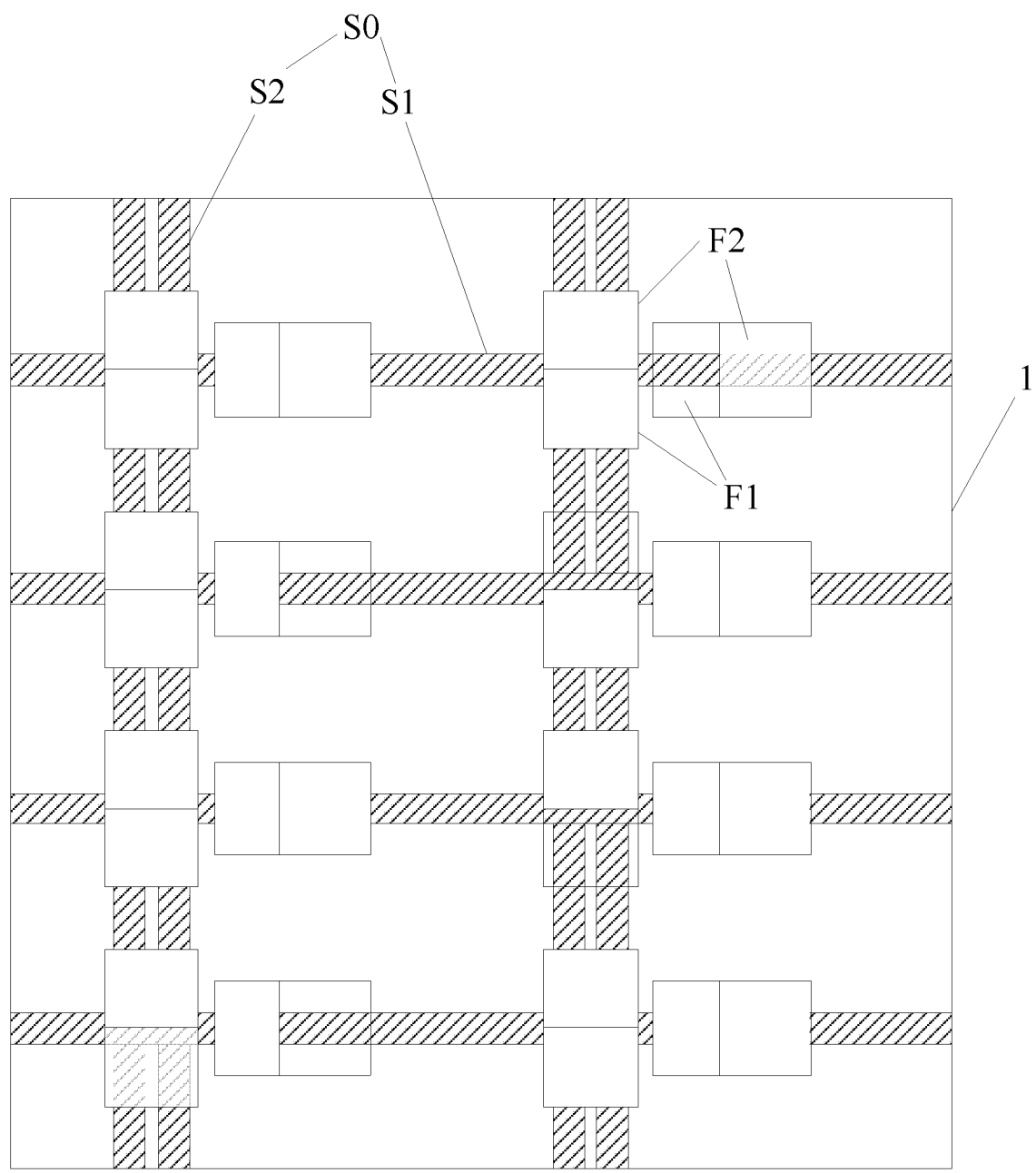
Figure 7:
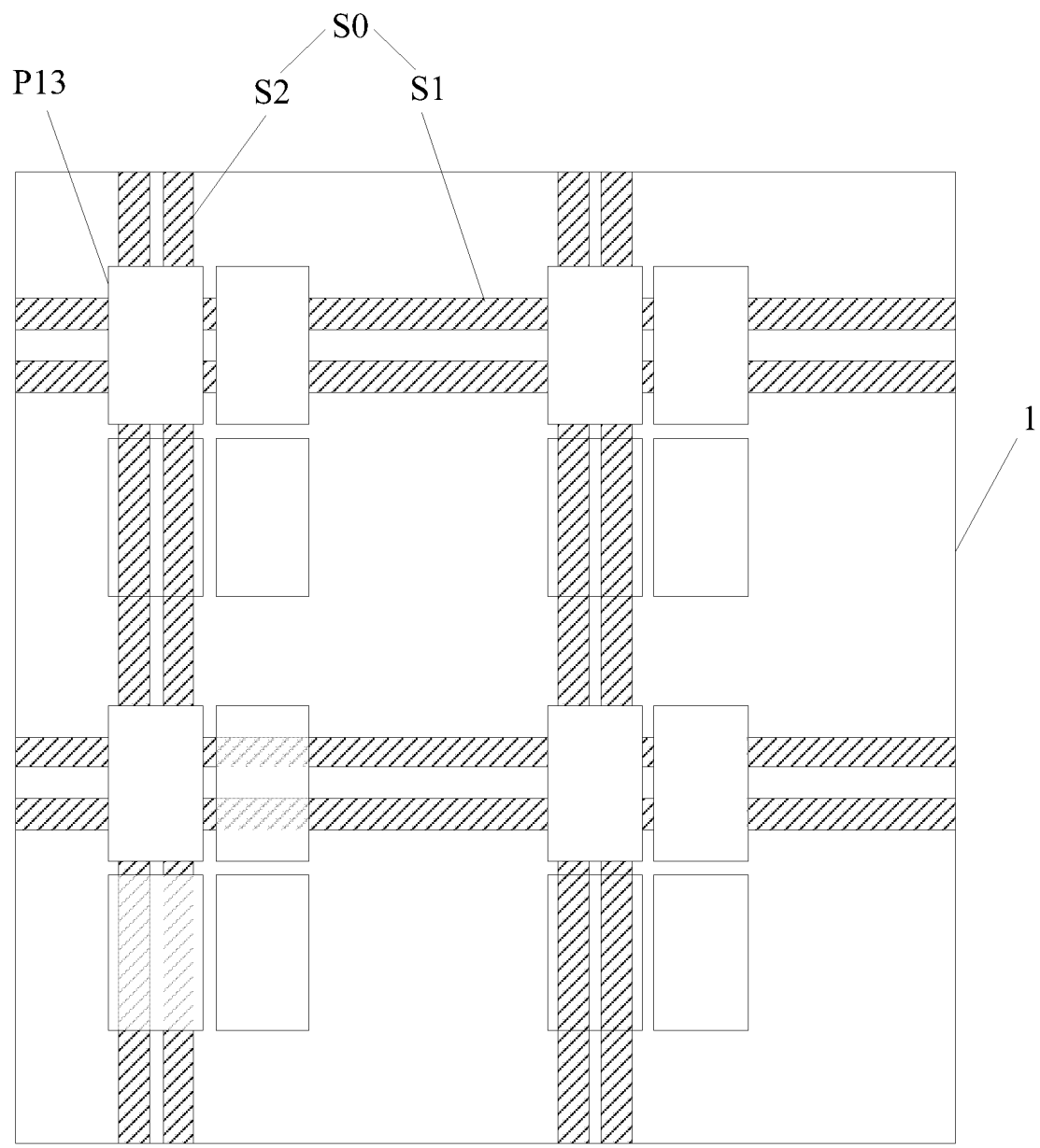

In one or more embodiments of the disclosure, in the photosensitive device arranging region G, a plurality of overlap areas being located in the orthographic projection of one first pixel on the base substrate, includes that two overlap areas are located in the orthographic projection of one first pixel on the base substrate, as illustrated in FIGS. 3, 5 and 6; or that three overlap areas are located in the orthographic projection of one first pixel on the base substrate, as illustrated in FIG. 4; or that four overlap areas are located in the orthographic projection of one first pixel on the base substrate, as illustrated in FIG. 7; of course, it is also possible that N overlap areas are located in the orthographic projection of one first pixel on the base substrate (not shown in the figure), where N is an integer greater than 4, not limited here, and set according to the actual demand, to increase the design flexibility and further improve the light transmittance of the photosensitive device arranging region G.

In one embodiment, in the structure as illustrated in FIG. 3 according to one or more embodiments, the overlap areas of the orthographic projections of one second signal line S2 and two first signal lines S1 on the base substrate are located in the orthographic projection of the same first pixel (e.g., the first pixel marked as P11 in FIG. 3) on the base substrate.

In another embodiment, in the structure as illustrated in FIG. 5 according to one or more embodiments, the overlap areas of the orthographic projections of one first signal line S1 and two second signal lines S2 on the base substrate are located in the orthographic projection of the same first pixel (e.g., the first pixel marked as P12 in FIG. 5) on the base substrate.

In yet another embodiment, in the structure as illustrated in FIG. 7 according to one or more embodiments, the overlap areas of the orthographic projections of two first signal lines S1 and two second signal lines S2 on the base substrate are located in the orthographic projection of the same first pixel (e.g., the first pixel marked as P13 in FIG. 7) on the base substrate.

In one or more embodiments of the disclosure, each pixel includes a light emitting unit, and the region where the light emitting unit is located can be understood as the opening region of the pixel. The pixel emits the light through this opening region, to implement the display function of the electroluminescent display panel. Here, that a plurality of overlap areas are located in the orthographic projection of one first pixel on the base substrate can be understood as that a plurality of overlap areas are located in one opening region.

Figure 8:
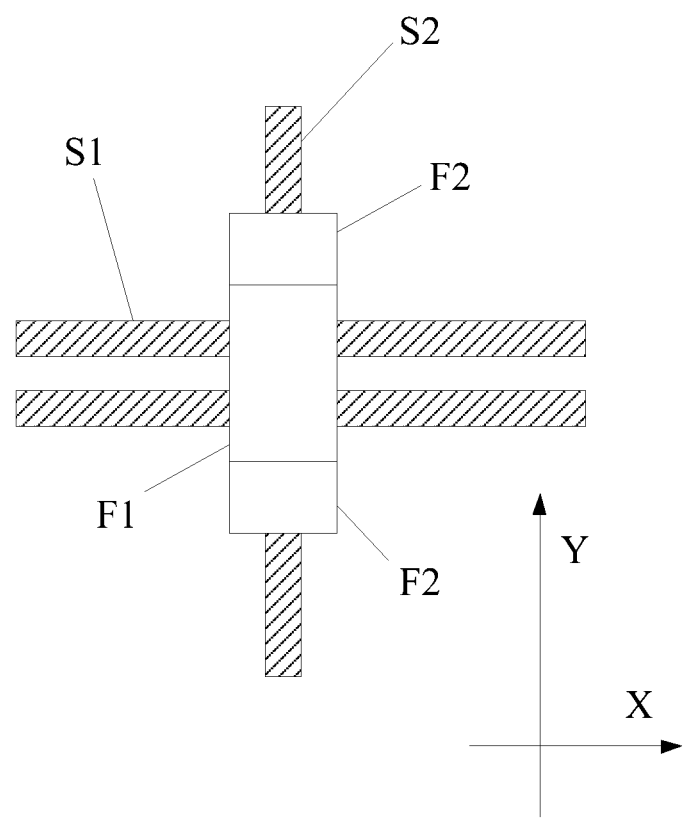
FIG. 8 is a structural schematic diagram of a first pixel provided in some embodiments of the disclosure.
Figure 9:
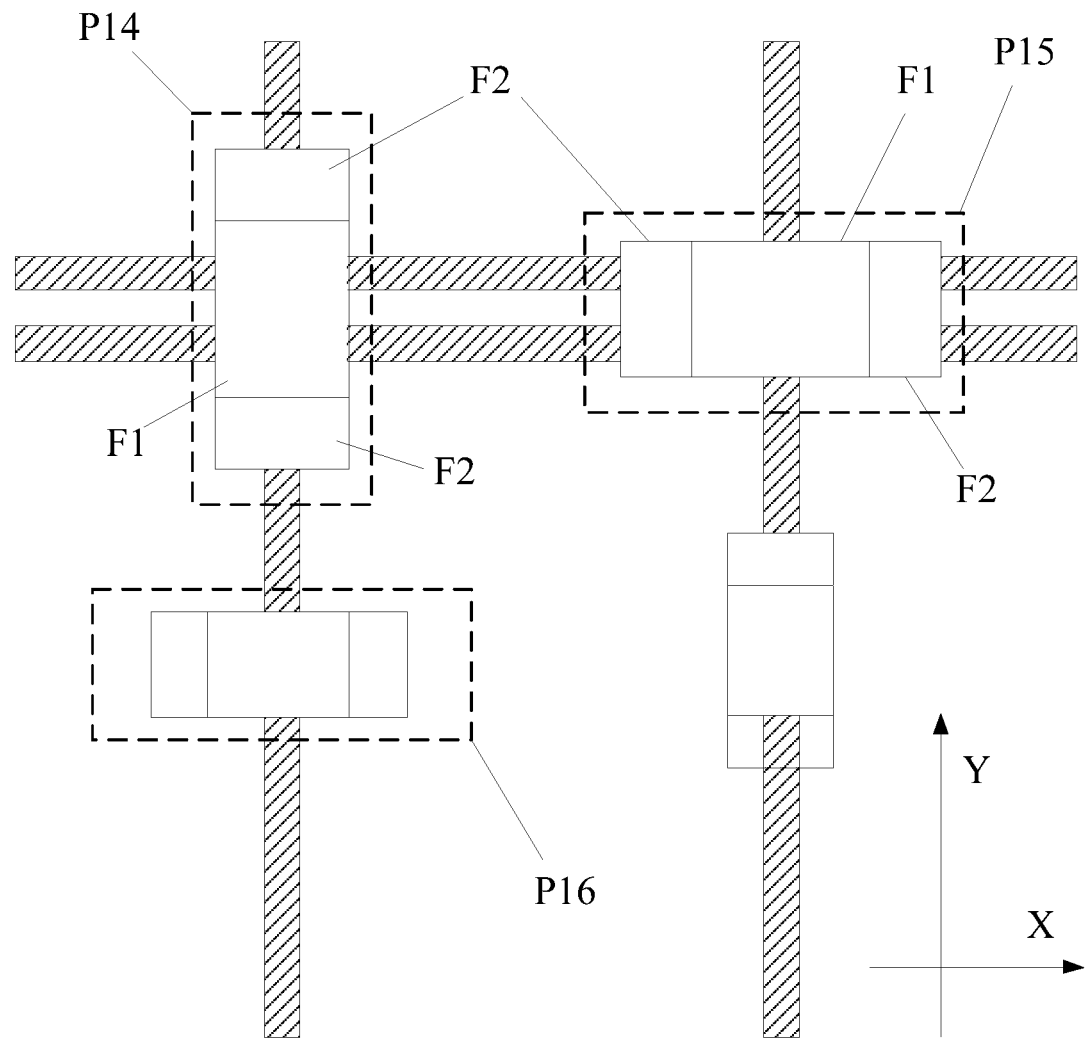
FIG. 9 is a structural schematic diagram of the adjacent first pixels provided in some embodiments of the disclosure.

In a specific implementation, in order to further improve the light transmittance of the photosensitive device arranging region G, in one or more embodiments of the disclosure, there can be several ways as follows:

First way:

In one or more embodiments, as illustrated in FIGS. 6, 8 and 9, the first pixel includes a first subsection F1 and at least one second subsection F2, where the respective second subsections are located at the edge of the first subsection F1 and connected to the first subsection F1, the arranging direction of the second subsections F2 and the first subsection F1 is parallel to the extending direction of the first signal lines S1 or the second signal lines S2.

In one embodiment, referring to the structural schematic diagram of the first pixel shown in FIG. 8, this first pixel includes one first subsection F1 and two second subsections F2, where the two second subsections F2 are located at two opposite sides of the first subsection F1 respectively, and the arranging direction of the first subsection F1 and the second subsections F2 is parallel to the extending direction of the second signal line S2 (the Y direction as illustrated in FIG. 8). At the same time, in FIG. 8, the orthographic projections of one second signal line S2 and each of two first signal lines S1 on the base substrate have an overlap area, and these two overlap areas are arranged along the Y direction.

That is, the arranging direction of two overlap areas is the same as the arranging direction of the first subsection F1 and the second subsections F2. The arrangement of the first subsection and the second subsections can facilitate the decrease in the length of the first pixels in the X direction in FIG. 8, to leave more space in the X direction for the light-transmission region, increase the area of the light-transmission region, and thus further improve the light transmittance of the photosensitive device arranging region G.

It is noted that the above-mentioned first and second subsections are used for illustrating the shape of the orthographic projection of the first pixel on the base substrate, but will not have a limitation on the relative connection relationships among all the structures included in the first pixel. Thus, the shape of the orthographic projection of the first pixel on the base substrate can be adjusted on the basis of remaining the structure of the first pixel unchanged, to improve the light transmittance of the photosensitive device arranging region.

In one or more embodiments of the disclosure, as illustrated in FIGS. 6 and 9, when the arranging direction of the first and second subsections is parallel to the extending direction of the first or second signal lines, in at least a part of first pixels which are adjacent to each other:

the first and second subsections in one first pixel are arranged along the first direction, and the first and second subsections in the other first pixel are arranged in the direction perpendicularly to the first direction;

where the first direction is the column or row direction.

In one or more embodiments, as illustrated in FIG. 6, for each first pixel arranged in the column direction, both the first subsection F1 and the second subsection F2 are arranged along the column direction; and for each first pixel arranged in the row direction, both the first subsection F1 and the second subsection F2 are arranged along the row direction.

In one or more embodiments, by taking the structural schematic diagram of the adjacent first pixels as illustrated in FIG. 9 as an example, two first pixels marked as P14 and P15 are arranged adjacently in the X direction; where the first subsection F1 and the second subsections F2 in the first pixel P14 are arranged along the Y direction, and the first subsection F1 and the second subsections F2 in the first pixel P15 are arranged along the X direction.

Similarly, two first pixels marked as P14 and P16 are arranged adjacently in the Y direction; where the first subsection F1 and the second subsections F2 in the first pixel P14 are arranged along the Y direction, and the first subsection F1 and the second subsections F2 in the first pixel P16 are arranged along the X direction.

Thus, by setting the arranging direction of the first subsection F1 and the second subsections F2 in the first pixel, not only the space occupied by the first pixel in the photosensitive device arranging region G can be adjusted to leave more space for the light-transmission region and further improve the light transmittance of the photosensitive device arranging region G but also the area of the opening region of the first pixel can be adjusted. Since the pixels include the first pixels located in the photosensitive device arranging region G and the second pixels located in the normal display region A1, and the arranging density of the first pixels is less than the arranging density of the second pixels, the area of the opening region of the first pixel can be adjusted to reduce the display brightness difference due to the low arranging density of the first pixels and to further improve the display uniformity.

Second way:

In one or more embodiments, signal line S0 is introduced and the relationship between the signal lines S0 (as illustrated in FIGS. 3-7) and the first pixels is described at first.

In one or more embodiments of the disclosure, M adjacent first signal lines located in the photosensitive device arranging region form a first signal line group, and the spacing between the adjacent first signal line groups is larger than the spacing between two adjacent first signal lines in one first signal line group; the orthographic projections of all the first signal lines in the first signal line group and the orthographic projection of one second signal line on the base substrate have M overlap areas, and the M overlap areas are located in the orthographic projection of at least one first pixel on the base substrate;

and/or, N adjacent second signal lines located in the photosensitive device arranging region form a second signal line group, and the spacing between the adjacent second signal line groups is larger than the spacing between two adjacent second signal lines in one second signal line group; the orthographic projections of all the second signal lines in the second signal line group and the orthographic projection of one first signal line on the base substrate have N overlap areas, and the N overlap areas are located in the orthographic projection of at least one first pixel on the base substrate;

where M and N are both integers greater than 1.

In one embodiment, referring to FIG. 3, Z1 represents one first signal line group which includes two first signal lines S1, the spacing between two adjacent first signal line groups Z1 is represented by h1, and the spacing between two adjacent first signal lines S1 in the first signal line group Z1 is represented by h2, where h1 is larger than h2. The orthographic projections of each first signal line group Z1 and one second signal line S2 on the base substrate have two overlap areas, i.e., M is 2, where these two overlap areas are located in the orthographic projection of one first pixel (e.g., the first pixel marked as P11 in FIG. 3) on the base substrate.

In another embodiment, referring to FIG. 7, there are the first signal line group (consisted of two first signal lines arranged closely) and the second signal line group (consisted of two second signal lines arranged closely), each first signal line group includes two first signal lines S1, each second signal line group includes two second signal lines S2, and the orthographic projections of each first signal line group and each second signal line group on the base substrate have four overlap areas, where the number of the overlap areas can be understood as M*N, that is, M is 2, N is 2, so M*N is 4, and these four overlap areas are located in the orthographic projection of one first pixel (e.g., the first pixel marked as P13 in FIG. 7) on the base substrate.

As can be seen, the setting of signal line group(s) can facilitate the implementation of locating a plurality of overlap areas in the orthographic projection of one first pixel on the base substrate, to facilitate improving the light transmittance of the photosensitive device arranging region G.

Based on this, in order to further improve the light transmittance of the photosensitive device arranging region G, in one or more embodiments, as illustrated in FIGS. 4-7, the length of the spacing in the first direction between two adjacent first pixels electrically connected to the signal lines in the same signal line group is the first length, and the length of the spacing in the first direction between the first pixels which are electrically connected to the signal lines in two adjacent signal line groups respectively and are adjacent in the first direction is the second length, where the first length is smaller than the second length;

where the signal lines are the first signal lines, the signal line groups are the first signal line groups, the first direction is the column direction; and/or the signal lines are the second signal lines, the signal line groups are the second signal line groups, the first direction is the row direction.

In one embodiment, referring to FIG. 4, for the first signal line group marked as Z2, the first pixels electrically connected to the first signal line group Z2 are marked as P18, P19 and P20 respectively, and the first pixel marked as P17 is the first pixel electrically connected to the first signal line group marked as Z3.

Here, among the respective first pixels (e.g., P18, P19 and P20) electrically connected to the first signal line group Z2 and the respective first pixels (only P17 is shown in the figure) electrically connected to the first signal line group Z3, two first pixels adjacent in the Y direction are P17 and P18 respectively, the spacing between them is the second length and represented by h4, and the spacing in the Y direction between two adjacent first pixels electrically connected to the signal lines in the first signal line group Z2 is the first length and represented by h3, where h3 is smaller than h4.

Thus, the first pixels electrically connected to the signal lines in the same signal line group are arranged more closely, to reduce the first length between these first pixels, so that more space can be left for the light-transmission region to further improve the light transmittance of the photosensitive device arranging region G.

In one or more embodiments of the disclosure, the signal line group includes at least three signal lines, and all the first lengths are the same. As illustrated in FIG. 4, the first length of any two first pixels of the first pixels P18, P19 and P20 in the first direction is h3.

Thus, the structure complexity of the electroluminescent display panel can be simplified, and the difficulty of fabricating the electroluminescent display panel can be lowered.

Third way:

In one or more embodiments of the disclosure, the orthographic projections of at least a part of the first pixels on the base substrate have a plurality of overlap areas.

In one or more embodiments, the orthographic projections of a part of the first pixels on the base substrate have a plurality of overlap areas. In one embodiment, as illustrated in FIG. 9, the orthographic projection of each of the first pixels marked as P14 and P15 on the base substrate has two overlap areas, and the orthographic projection of the first pixel marked as P16 on the base substrate has no overlap area.

Thus, a part of the first signal lines S1 and a part of the second signal lines S2 are arranged more intensively, to leave the more and more concentrated space as the light-transmission region to some extent, so that the light transmittance of the photosensitive device arranging region G can be increased to some extent.

In one or more embodiments, the orthographic projections of all the first pixels on the base substrate have a plurality of overlap areas. In one embodiment, as illustrated in FIG. 10, the region filled with the sparse black spots represents a part of the photosensitive device arranging region G, and as shown, the orthographic projection of each of three first pixels located in this region on the base substrate has two overlap areas.

Thus, on the one hand, the first signal lines S1 and the second signal lines S2 can be arranged more intensively to the most extent, in order to leave the more and more concentrated space as the light-transmission region, so that the light transmittance of the photosensitive device arranging region G can be increased as much as possible, to provide more lights to the camera or fingerprint recognition device so that the camera or fingerprint recognition device can work normally and efficiently. On the other hand, different settings can be performed according to the actual demand, to increase the design flexibility and also meet the requirements of different application scenarios.

Based on this, in one or more embodiments of the disclosure, the orthographic projections of a part of the first pixels on the base substrate have a plurality of overlap areas, and the orthographic projections of the other first pixels on the base substrate have no overlap area;

the area of the orthographic projection of the first pixel corresponding to no overlap area on the base substrate is smaller than the area of the orthographic projection of the first pixel corresponding to a plurality of overlap areas on the base substrate.

In one embodiment, by taking the structure shown in FIG. 9 as an example, the orthographic projection of each of the first pixels marked as P14 and P15 on the base substrate has two overlap areas, and the orthographic projection of the first pixel marked as P16 on the base substrate has no overlap area, where the area of the orthographic projection of the first pixel P14 on the base substrate is larger than the area of the orthographic projection of the first pixel P16 on the base substrate.

Thus, the space occupied by the first pixel corresponding to no overlap area can be reduced, to leave more space as the light-transmission region and further improve the light transmittance of the photosensitive device arranging region G.

In one or more embodiments of the disclosure, the areas of the orthographic projections of all the first pixels on the base substrate are the same, as illustrated in FIGS. 3-7 and 10. Thus, the difficulty of fabricating the first pixel may be lowered greatly, and then the difficulty of fabricating the electroluminescent display panel is lowered, to improve the production efficiency and the product yield of the display devices.

It is necessary to note that the three ways described above can be used in combination or used separately in the actual situation, which is not limited here, and can be set and selected according to the actual demand, to increase the design flexibility and also meet the requirements of different application scenarios.

In a specific implementation, for the structure as illustrated in FIG. 2, the normal display region A1 surrounds the photosensitive device arranging region G. Even if the arranging density of the first pixels is less than the arranging density of the second pixels, the second signal lines S2 extends to the photosensitive device arranging region G and passes through the photosensitive device arranging region G to the normal display region A1, so there are redundant second signal lines S2 arranged in the photosensitive device arranging region G at this time. In order to reduce the shielding of the second signal lines S2 for the light, the second signal lines S2 can be arranged specially.

For the structure as illustrated in FIG. 1, the photosensitive device arranging region G is located at the edge of one side of the display region A closed to the non-display region B. In one or more embodiments, since the arranging density of the first pixels is less than the arranging density of the second pixels, a part of the second signal lines S2 are set to extend into the photosensitive device arranging region G, to decrease the number of the second signal lines S2 arranged in the photosensitive device arranging region G and further improve the light transmittance of the photosensitive device arranging region G.

Similarly, in one or more embodiments, for the structure as illustrated in FIG. 1, all the second signal lines S2 is set to extend into the photosensitive device arranging region G, to facilitate reducing the load differences among all the second signal lines S2. At this time, in order to reduce the shielding of the second signal lines S2 for the light, there is also a need to arrange the second signal lines S2 specially.

Similarly, there is also a need to arrange the first signal lines S1 specially.

Therefore, in an embodiment of the disclosure, the shapes of the orthographic projections of the first signal lines S1 and/or the second signal lines S2 passing through the photosensitive device arranging region G on the base substrate can be the folded-line shape, as illustrated in FIG. 10.

Thus, it is possible to facilitate the closer arrangement of all the signal lines (including the first signal lines S1 and the second signal lines S2) in the photosensitive device arranging region G to provide the larger light-transmission region, to locate a plurality of overlap areas in the orthographic projection of one first pixel on the base substrate and improve the light transmittance of the photosensitive device arranging region G.

In one or more embodiments, in order to implement the above-mentioned arrangement of the signal lines, each of the first signal lines and/or the second signal lines passing through the photosensitive device arranging region includes: a first segment, a second segment, and a third segment connecting the first and second segments, where the first segment is located in the normal display region and extends along the second direction, the second segment is located in the photosensitive device arranging region and extends along the second direction, and the third segment extends along the third direction;

where the third direction intersects with the row direction and the column direction respectively; the first signal line includes: a first segment, a second segment and a third segment, and the second direction is the row direction; the second signal line includes: a first segment, a second segment and a third segment, and the second direction is the column direction.

In one embodiment, referring to the structure as illustrated in FIG. 10, the second signal line at the rightmost in the figure is marked as S21, and this second signal line S21 includes: a first segment D1, a second segment D2, and a third segment D3 connecting the first segment D1 and the second segment D2, where both the first segment D1 and the second segment D2 extend along the Y direction, and the third segment D3 extends along the third direction (i.e., K direction as illustrated in the figure).

Thus, the shape of the orthographic projection of the signal line on the base substrate can be set to be the folded-line shape by the segmentation of the signal line, facilitating the closer arrangement of all the signal lines (including the first signal lines S1 and the second signal lines S2) in the photosensitive device arranging region G to provide the larger light-transmission region, to locate a plurality of overlap areas in the orthographic projection of one first pixel on the base substrate and improve the light transmittance of the photosensitive device arranging region G.

Figure 11:
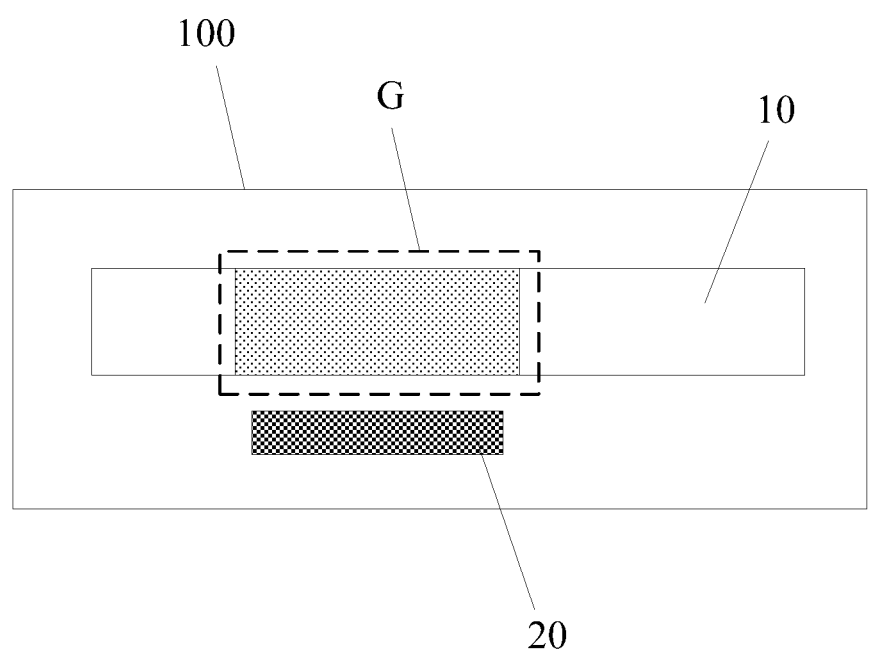
FIG. 11 is a structural schematic diagram of a display device provided in some embodiments of the disclosure.

Based upon the same inventive concept, one or more embodiments of the disclosure provides a display device 100, and as illustrated in FIG. 11 which is a structural schematic diagram of the display device, the display device 100 includes the electroluminescent display panel 10 described above and provided by the embodiments of the disclosure.

Here, as illustrated in FIG. 11, an photosensitive device 20 is arranged at the place corresponding to the photosensitive device arranging region G of the electroluminescent display panel 10, and the photosensitive device 20 may be a camera or fingerprint recognition device.

In one or more embodiments, the display device may be a mobile phone, a tablet, a television, a display, a laptop, a digital photo frame, a navigator, or any other product or component with display functions. The implementations of this display device can refer to the embodiments of the electroluminescent display panel described above, and this display device also has the beneficial effects owned by the electroluminescent display panel described above, and the repeated description thereof will be omitted here.

For the electroluminescent display panel and the display device provided by the embodiments of the disclosure, firstly the display region includes a photosensitive device arranging region, and a camera or fingerprint recognition device is arranged in the photosensitive device arranging region, rather than in the frame, and thus a relatively larger area occupying in the frame is avoided, to allow the frame be made narrower, and the screen-to-body ratio be increased.

Secondly for the photosensitive device arranging region, the first signal lines and the second signal lines are arranged more intensively by arranging a plurality of overlap areas in the orthographic projection of one first pixel on the base substrate, to allow the display panel have more concentrated space as the light-transmission region, so that the light transmittance of the photosensitive device arranging region can be increased to provide more lights to the camera or fingerprint recognition device so that the camera or fingerprint recognition device can work normally and efficiently.

What is claimed is:

1. An electroluminescent display panel, comprising:
   a display region comprising a photosensitive device arranging region and a normal display region which at least partly surrounds the photosensitive device arranging region;
   the display region comprises a plurality of pixels comprising first pixels located in the photosensitive device arranging region, wherein a region between adjacent first pixels among the first pixels is a light-transmission region;
   the electroluminescent display panel further comprises: a base substrate, and a plurality of first signal lines and a plurality of second signal lines located on the base substrate, wherein the first pixels are electrically connected to the plurality of first signal lines and the second signal lines respectively, the plurality of first signal lines are arranged in a column direction and extend in a row direction, and the plurality of second signal lines are arranged in the row direction and extend in the column direction; and
   orthographic projections of the plurality of first signal lines and the plurality of second signal lines on the base substrate have overlap areas, and in the photosensitive device arranging region, a plurality of overlap areas are located in an orthographic projection of one first pixel on the base substrate.

2. The electroluminescent display panel of claim 1, wherein the one first pixel comprises a first subsection and at least one second subsection connected to the first subsection, wherein the second subsection is located at an edge of a connected first subsection, and an arranging direction of the first and second subsections is parallel to an extending direction of the plurality of first signal lines or the second signal lines.

3. The electroluminescent display panel of claim 2, wherein in at least a part of the adjacent first pixels, first and second subsections in the one first pixel are arranged along a first direction, and first and second subsections in another first pixel are arranged in a direction perpendicularly to the first direction;
   wherein the first direction is the column or the row direction.

4. The electroluminescent display panel of claim 1, wherein each of orthographic projections of at least a part of the first pixels on the base substrate has the plurality of overlap areas.

5. The electroluminescent display panel of claim 4, wherein each of orthographic projections of a part of the first pixels on the base substrate has the plurality of overlap areas, and orthographic projections of other first pixels on the base substrate have no overlap area;
   an area of an orthographic projection of a first pixel corresponding to no overlap area on the base substrate is smaller than an area of an orthographic projection of a first pixel corresponding to the plurality of overlap areas on the base substrate.

6. The electroluminescent display panel of claim 4, wherein areas of the orthographic projections of all the first pixels on the base substrate are same.

7. The electroluminescent display panel of claim 1, wherein one or a combination of following cases are included:
   in a first case: M adjacent first signal lines located in the photosensitive device arranging region form a first signal line group, and a spacing between adjacent first signal line groups is larger than a spacing between two adjacent first signal lines in the first signal line group; orthographic projections of respective first signal lines in the first signal line group and an orthographic projection of one second signal line on the base substrate have M overlap areas, and the M overlap areas are located in an orthographic projection of at least one first pixel on the base substrate; and
   in a second case: N adjacent second signal lines located in the photosensitive device arranging region form a second signal line group, and a spacing between adjacent second signal line groups is larger than a spacing between two adjacent second signal lines in the second signal line group; orthographic projections of respective second signal lines in the second signal line group and an orthographic projection of one first signal line on the base substrate have N overlap areas, and the N overlap areas are located in an orthographic projection of at least one first pixel on the base substrate;
   wherein M and N are both integers greater than 1.

8. The electroluminescent display panel of claim 7, wherein one or a combination of following cases are included:
   a third case: a length of a spacing in the column direction between two of the adjacent first pixels electrically connected to first signal lines in a same first signal line group is a first length, and a length of a spacing in the column direction between first pixels which are electrically connected to first signal lines in two of the adjacent first signal line groups respectively and are adjacent in the column direction is a second length, wherein the first length is smaller than the second length; and
   a fourth case: a length of a spacing in the row direction between two of the adjacent first pixels electrically connected to second signal lines in a same second signal line group is a third length, and a length of a spacing in the row direction between first pixels which are electrically connected to second signal lines in two of the adjacent second signal line groups respectively and are adjacent in the row direction is a fourth length, wherein the third length is smaller than the fourth length.

9. The electroluminescent display panel of claim 8, wherein at least one of the first signal line group and the second signal line group comprises at least three signal lines, and the first length and the third length are same.

10. The electroluminescent display panel of claim 1, wherein a shape of an orthographic projection of the first signal line and the second signal line passing through the photosensitive device arranging region on the base substrate is a folded-line shape.

11. The electroluminescent display panel of claim 10, wherein each of the plurality of first signal lines passing through the photosensitive device arranging region comprises: a first segment, a second segment, and a third segment connecting the first and second segments, wherein the first segment is located in the normal display region and extends along a second direction, the second segment is located in the photosensitive device arranging region and extends along the second direction, and the third segment extends along a third direction;

wherein the third direction intersects with the row direction and the column direction respectively, and the second direction is the row direction, or the second direction is the column direction.

12. The electroluminescent display panel of claim 11, wherein the pixels further comprise: second pixels located in the normal display region;

in the normal display region, orthographic projections of at least a part of the second pixels on the base substrate have one overlap area.

13. The electroluminescent display panel of claim 10, wherein each of the second signal lines passing through the photosensitive device arranging region comprises: a first segment, a second segment, and a third segment connecting the first and second segments, wherein the first segment is located in the normal display region and extends along a second direction, the second segment is located in the photosensitive device arranging region and extends along the second direction, and the third segment extends along a third direction;

wherein the third direction intersects with the row direction and the column direction respectively, and the second direction is the row direction, or the second direction is the column direction.

14. The electroluminescent display panel of claim 13, wherein the pixels further comprise: second pixels located in the normal display region;

in the normal display region, orthographic projections of at least a part of the second pixels on the base substrate have one overlap area.

15. The electroluminescent display panel of claim 1, wherein the first signal line is scan line, reference signal line or light emission control signal line, and the second signal line is data line or power supply signal line.

16. The electroluminescent display panel of claim 2, wherein the first signal line is scan line, reference signal line or light emission control signal line, and the second signal line is data line or power supply signal line.

17. The electroluminescent display panel of claim 4, wherein the first signal line is scan line, reference signal line or light emission control signal line, and the second signal line is data line or power supply signal line.

18. The electroluminescent display panel of claim 7, wherein the first signal line is scan line, reference signal line or light emission control signal line, and the second signal line is data line or power supply signal line.

19. The electroluminescent display panel of claim 10, wherein the first signal line is scan line, reference signal line or light emission control signal line, and the second signal line is data line or power supply signal line.

20. A display device, comprising the electroluminescent display panel of claim 1; wherein a camera or fingerprint recognition device is arranged in the photosensitive device arranging region of the electroluminescent display panel.

\* \* \* \* \*